US012614015B2

(12) United States Patent
Lei et al.

(10) Patent No.: US 12,614,015 B2
(45) Date of Patent: Apr. 28, 2026

(54) SYSTEM AND METHOD FOR TRANSISTOR PLACEMENT IN STANDARD CELL LAYOUT

(71) Applicant: Taiwan Semiconductor Manufacturing Company, Ltd., Hsinchu (TW)

(72) Inventors: Cheok-Kei Lei, Hsinchu (TW); Chi-Lin Liu, Hsinchu (TW); Yu-Lun Ou, Hsinchu (TW); Chien-Hsing Li, Hsinchu (TW); Zhe-Wei Jiang, Hsinchu (TW); Hui-Zhong Zhuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 856 days.

(21) Appl. No.: 16/732,206

(22) Filed: Dec. 31, 2019

(65) Prior Publication Data

US 2021/0200927 A1     Jul. 1, 2021

(51) Int. Cl.
*G06F 30/392*          (2020.01)
*G06F 30/327*          (2020.01)
(Continued)

(52) U.S. Cl.
CPC .......... *G06F 30/392* (2020.01); *G06F 30/327* (2020.01); *H01L 23/5286* (2013.01); *H10D 89/10* (2025.01)

(58) Field of Classification Search
CPC . G06F 30/392; G06F 30/327; H01L 23/5286; H01L 27/0207; H01L 21/823425
See application file for complete search history.

(56) References Cited

U.S. PATENT DOCUMENTS 4,786,613 A * 11/1988 Gould ................. H01L 27/0207
                                                         438/129
2008/0121995 A1* 5/2008 Anderson ................ H10D 8/00
                                                         257/E27.06

(Continued)

FOREIGN PATENT DOCUMENTS

TW          201443535 A * 11/2014  ......... H01L 27/1222

OTHER PUBLICATIONS

Uppili et al., "Standard cell library and automated design flow for circuits on flexible substrates," 2009 Flexible Electronics & Displays Conference and Exhibition, Phoenix, AZ, USA, 2009, pp. 1-5, doi: 10.1109/FEDC.2009.5069270.*

(Continued)

*Primary Examiner* — Ajay Ojha
*Assistant Examiner* — Kenneth S. Stephenson
(74) *Attorney, Agent, or Firm* — Foley & Lardner LLP

(57)               ABSTRACT

A system and method for transistor placement in a standard cell layout includes identifying a plurality of transistors in a circuit. A drain terminal of each of the plurality of transistors is connected to an output of the circuit. The system and method also include determining that a first transistor and a second transistor of the plurality of transistors satisfy a merging priority, combining an active region of the first transistor and the second transistor to form a mega transistor having a common active region, and replacing the first transistor and the second transistor in the standard cell layout of the circuit with the mega transistor. The common active region combines the active region of a first drain terminal of the first transistor and a second drain terminal of the second transistor.

20 Claims, 8 Drawing Sheets

(51) Int. Cl.
    *H01L 23/528*     (2006.01)
    *H10D 89/10*     (2025.01)

(56)           References Cited

U.S. PATENT DOCUMENTS

| | | | |
|---|---|---|---|
| 2009/0273367 A1* | 11/2009 | Bittlestone ....... | H03K 19/17728 |
| | | | 326/38 |
| 2010/0133589 A1* | 6/2010 | Aruga ................... | H01L 27/092 |
| | | | 257/206 |
| 2014/0332826 A1* | 11/2014 | Wang ................... | H01L 27/124 |
| | | | 257/88 |
| 2017/0358584 A1* | 12/2017 | Wang ..................... | H10B 12/03 |

OTHER PUBLICATIONS

Machine English translation of TW 201443535.*

* cited by examiner

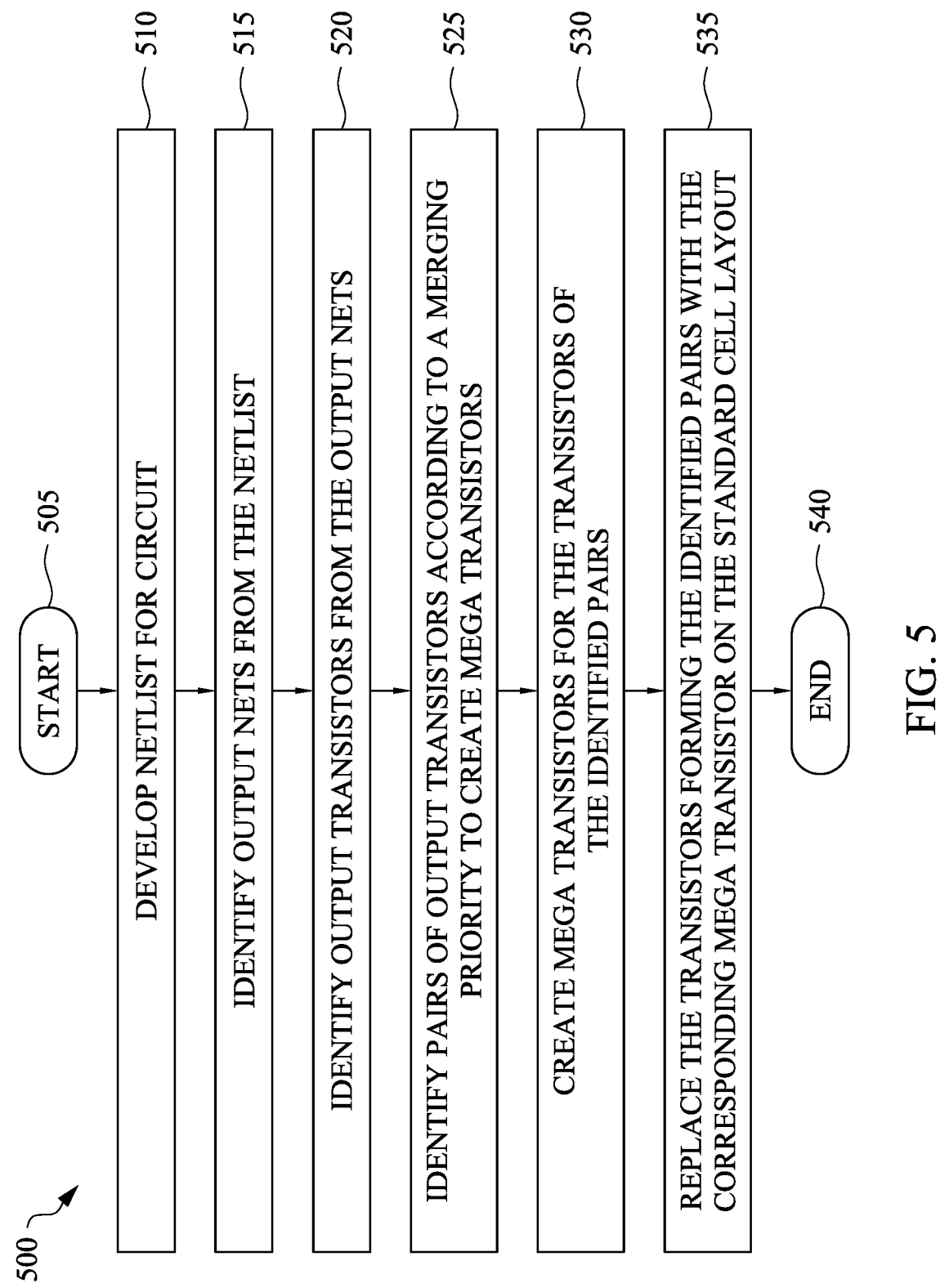

500

START — 505

DEVELOP NETLIST FOR CIRCUIT — 510

IDENTIFY OUTPUT NETS FROM THE NETLIST — 515

IDENTIFY OUTPUT TRANSISTORS FROM THE OUTPUT NETS — 520

IDENTIFY PAIRS OF OUTPUT TRANSISTORS ACCORDING TO A MERGING PRIORITY TO CREATE MEGA TRANSISTORS — 525

CREATE MEGA TRANSISTORS FOR THE TRANSISTORS OF THE IDENTIFIED PAIRS — 530

REPLACE THE TRANSISTORS FORMING THE IDENTIFIED PAIRS WITH THE CORRESPONDING MEGA TRANSISTOR ON THE STANDARD CELL LAYOUT — 535

END — 540

FIG. 5

SYSTEM AND METHOD FOR TRANSISTOR PLACEMENT IN STANDARD CELL LAYOUT

BACKGROUND

The present disclosure relates generally to standard cell layout, and particularly to a transistor placement during the standard cell layout.

Integrated circuits are widely used in a variety of applications. Designing an integrated circuit is a multi-step process. Specifically, the design of an integrated circuit begins with a description of the functionality desired from the integrated circuit. From the functional description, a transistor level circuit is designed and a netlist that defines the connectivity of the various transistors in the circuit is developed. The netlist may be simulated and tested to verify that the circuit implements the desired functionality and to predict operating parameters. From the netlist, a standard cell layout is created of the circuit. The standard cell layout includes a placement of cells (e.g., transistors) from a standard cell library and shows how those cells are interconnected. However, present day standard cell layout techniques have limitations in the way the standard cell layouts are developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is an example flowchart outlining operations for performing standard cell layout using mega transistors, in accordance with some embodiments.

DETAILED DESCRIPTION

Figure 1:
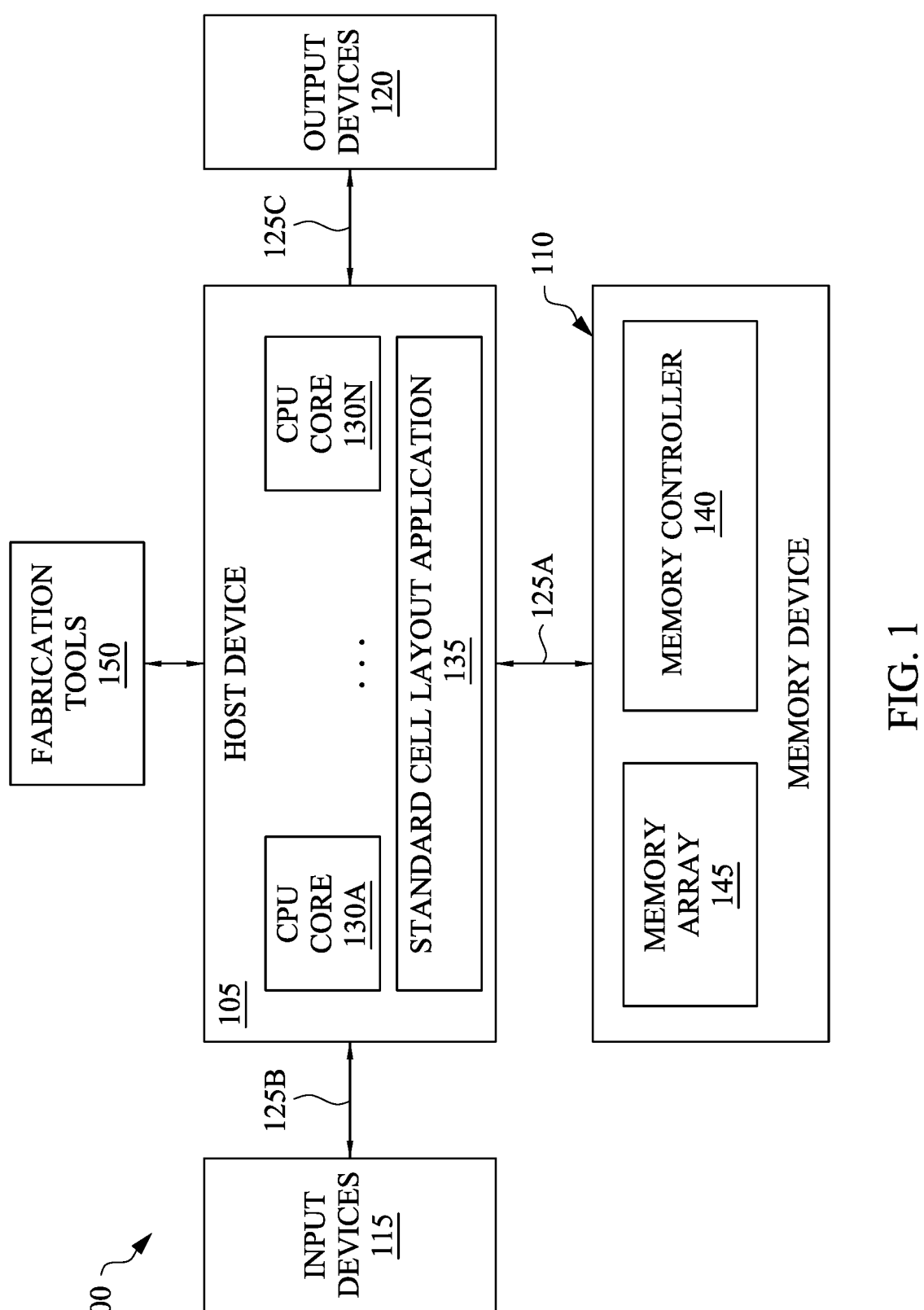
FIG. 1 is an example block diagram of a computing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, an example block diagram of a computing system 100 is shown, in accordance with some embodiments of the disclosure. The computing system 100 may be used by a circuit or layout designer for performing a standard cell layout of a circuit. A "circuit" as used herein is an interconnection of electrical components such as resistors, transistors, switches, batteries, inductors, or other types of semiconductor devices configured for implementing a desired functionality. The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, servers, data centers, etc.), tablets, personal digital assistants, mobile devices, other handheld or portable devices, or any other computing unit suitable for performing standard cell layout using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user (e.g., a circuit or layout designer), to enter information (e.g., data) into the host device and send instructions to the host device. Similarly, the output devices 120 may include a variety of output technologies such as external memories, printers, speakers, displays, microphones, light emitting diodes, headphones, video devices, and any other output peripherals that are configured to receive information (e.g., data) from the host device 105. The "data" that is either input into the host device 105 and/or output from the host device may include any of a variety of textual data, circuit data, signal data, semiconductor device data, graphical data, combinations thereof, or other types of analog and/or digital data that is suitable for processing using the computing system 100.

The host device 105 includes or is associated with one or more processing units/processors, such as Central Processing Unit ("CPU") cores 130A-130N. The CPU cores 130A-130N may be implemented as an Application Specific Integrated Circuit ("ASIC"), Field Programmable Gate Array ("FPGA"), or any other type of processing unit. Each of the CPU cores 130A-130N may be configured to execute instructions for running one or more applications of the host device 105. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations. One such application that the host device 105 may be configured to run may be a standard cell layout application 135. The standard cell layout application 135 may be part of a computer aided design or electronic design automation software suite that may be used by a user of the host device 105 to create a standard cell layout of a circuit. In some embodiments, the instructions needed to execute or run the standard cell layout application 135 may be stored within the memory device 110. The standard cell layout application 135 may be executed by one or more of the CPU cores 130A-130N using the instructions associated with the standard cell layout application from the memory device 110.

Referring still to FIG. 1, the memory device 110 includes a memory controller 140 that is configured to read data from or write data to a memory array 145. The memory array 145 may include a variety of volatile and/or non-volatile memories. For example, in some embodiments, the memory array 145 may include NAND flash memory cores. In other embodiments, the memory array 145 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 145 may be individually and independently controlled by the memory controller 140. In other words, the memory controller 140 may be configured to communicate with each memory within the memory array 145 individually and independently. By communicating with the memory array 145, the memory controller 140 may be configured to read data from or write data to the memory array in response to instructions received from the host device 105. Although shown as being part of the memory device 110, in some embodiments, the memory controller 140 may be part of the host device 105 or part of another component of the computing system 100 and associated with the memory device. The memory controller 140 may be implemented as a logic circuit in either software, hardware, firmware, or combination thereof to perform the functions described herein. For example, in some embodiments, the memory controller 140 may be configured to retrieve the instructions associated with the standard cell layout application 135 stored in the memory array 145 of the memory device 110 upon receiving a request from the host device 105.

In some embodiments, the computing system 100 may also be associated with various fabrication tools 150. Among other things, the fabrication tools 150 may be used to prepare and fabricate a set of masks based on the standard cell layout created by the standard cell layout application 135. The set of masks may define the geometry for the photolithography steps used during semiconductor fabrication of the circuit. Although the fabrication tools 150 are shown separate from the host device 105, in some embodiments, at least some of the functionality of the fabrication tools may be implemented by the host device such as by the standard cell layout application 135 or another application associated with the standard cell layout application.

To prepare a set of masks, the fabrication tools 150 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction (OPC) using lithography enhancement techniques to compensate for image errors, such as those that can arise from diffraction, interference, other process effects and the like, in the standard cell layout. In some embodiments, a mask rule checker (MRC) of the fabrication tools 150 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques (RET), such as off-axis illumination, sub-resolution assist features, phase-shifting masks, other suitable techniques, and the like or combinations thereof.

The preparation of the set of masks may further include, in some embodiments, lithography process checking (LPC) that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet (UV) beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

It is to be understood that although the fabrication tools 150 are described as performing certain operations for preparing the set of masks and then fabricating the set of masks, in some embodiments, the various processes may vary from those described. In some embodiments, additional or other processes or operations may be used to prepare the set of masks and fabricate the set of masks. It is also to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 140 and the memory array 145 may include other hardware, software, and/or firmware components that are considered necessary or desirable in performing the functions described herein.

Figure 2:
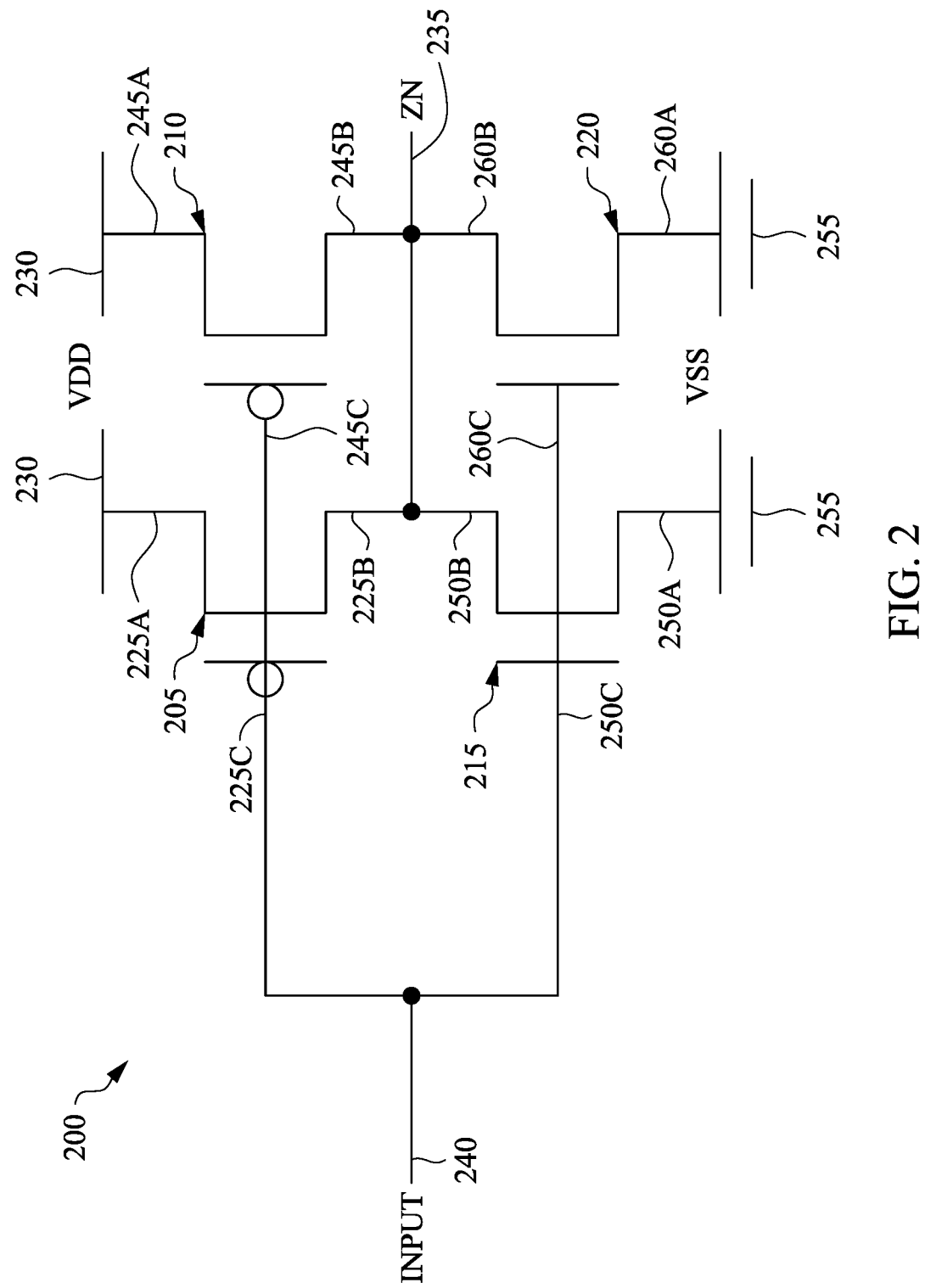
FIG. 2 is an example inverter circuit, in accordance with some embodiments.

Turning to FIG. 2, an example inverter circuit 200 is shown, in accordance with some embodiments of the present disclosure. The inverter circuit 200 is configured to invert an input value. For example, when an input value corresponding to a HIGH voltage value (e.g., bit level "1") is input into the inverter circuit 200, the inverter circuit generates a LOW voltage value (e.g., bit level "0") at an output. Similarly, when a LOW voltage value is input into the inverter circuit 200, the inverter circuit generates a HIGH voltage value at the output. The inverter circuit 200 is used herein simply as an example to explain the creation of a mega transistor, and without intending to be limiting in any way. The present disclosure may be used to create mega transistors in a variety of circuits and semiconductor devices that may benefit from reduced parasitic resistance and reduced parasitic capacitance, as discussed below.

The inverter circuit 200 includes a first p-type transistor 205, a second p-type transistor 210, a first n-type transistor 215, and a second n-type transistor 220. Each of the first p-type transistor 205, the second p-type transistor 210, the first n-type transistor 215, and the second n-type transistor 220 includes a source terminal, a drain terminal, and a gate terminal that is connected to a signal. For example, the first p-type transistor 205 includes a first p-type source terminal 225A connected to a supply voltage signal (e.g., VDD) 230, a first p-type drain terminal 225B connected to an output signal (e.g., ZN) 235, and a first p-type gate terminal 225C connected to an input signal 240. Similarly, the second p-type transistor 210 includes a second p-type source terminal 245A connected to the supply voltage signal 230, a second p-type drain terminal 245B connected to the output signal 235, and a second p-type gate terminal 245C connected to the input signal 240. The first n-type transistor 215 includes a first n-type source terminal 250A connected to a ground voltage signal (e.g., VSS) 255, a first n-type drain terminal 250B connected to the output signal 235, and a first n-type gate terminal 250C connected to the input signal 240. Similarly, the second n-type transistor 220 includes a second n-type source terminal 260A connected to the ground voltage signal 255, a second n-type drain terminal 260B connected to the output signal 235, and a second n-type gate terminal 260C connected to the input signal 240.

Each of the first p-type transistor 205, the second p-type transistor 210, the first n-type transistor 215, and the second n-type transistor 220 is an "output transistor" since the drain terminal of each of those transistors is connected to the output signal 235. For example, since the first p-type drain terminal 225B of the first p-type transistor 205 is connected to the output signal 235, the first p-type transistor is an output transistor. Similarly, since the second p-type drain terminal 245B of the second p-type transistor 210 is connected to the output signal 235, the second p-type transistor is also an output transistor. Further, since the first n-type drain terminal 250B of the first n-type transistor 215 is connected to the output signal 235, the first n-type transistor is an output transistor and since the second n-type drain terminal 260B of the second n-type transistor 220 is connected to the output signal, the second n-type transistor is also an output transistor. Although, the drain terminals of the first p-type transistor 205, the second p-type transistor 210, the first n-type transistor 215, and the second n-type transistor 220 are connected to the output signal 235, in some embodiments, the source terminals of those transistors may be connected to the output signal 235 for those transistors to be considered an output transistor. Generally speaking, if any terminal of a transistor is directly connected to an output signal (e.g., the output signal 235), that transistor may be considered an output transistor. Further, as described below, the output signal 235 may be the final or overall output of a circuit in a single stage or multi-stage circuit, or the output signal may be an intermediate output of one stage in a multi-stage circuit.

Additionally, a path from the supply voltage to the output in a p-type transistor and from the output to a ground voltage in an n-type transistor are critical paths in a standard cell circuit. For example, in the inverter circuit 200, the path from the supply voltage signal 230 to the output signal 235 is a critical path for each of the first p-type transistor 205 and the second p-type transistor 210. Similarly, the path from the output signal 235 to the ground voltage signal 255 is a critical path for the first n-type transistor 215 and the second n-type transistor 220. In some embodiments, a path in a circuit having a maximum delay or greater delay compared to other paths may be considered a "critical path." In other embodiments, a path may be considered "critical" based upon other operating parameters (e.g., parasitic resistance, parasitic capacitance, power consumption, etc.) of the circuit such that changing the values of those operating parameters may improve the operation of the underlying circuit.

When a conventional standard cell layout is created for the inverter circuit 200, each of the first p-type transistor 205, the second p-type transistor 210, the first n-type transistor 215, and the second n-type transistor 220 may be placed on the standard cell layout. The conventional standard cell layout may place the first p-type transistor 205, the second p-type transistor 210, the first n-type transistor 215, and the second n-type transistor 220 without considering the layout parasitic resistance or parasitic capacitance in the critical paths of the inverter circuit 200. In advanced integrated circuits, the layout parasitic resistance and parasitic capacitance may be a major barrier to the performance of a circuit. For example, higher parasitic resistance and parasitic capacitance may reduce speed of a circuit and increase power consumption. Thus, since conventional standard cell layouts are created without consideration of the layout parasitic resistance and parasitic capacitance, conventional standard cell layouts may suffer from reduced performance and increased power consumption.

The present disclosure provides a mechanism to reduce the layout parasitic resistance and parasitic capacitance during the placement of transistors in a standard cell layout. Specifically, the present disclosure provides a mechanism for creating an additional current path in the critical paths of a circuit to reduce the layout parasitic resistance and parasitic capacitance. For example, the present disclosure provides a mechanism to create an additional current path from the supply voltage to the output in a p-type transistor and from the output to the ground voltage in an n-type transistor to reduce the layout parasitic resistance and parasitic capacitance. By reducing the layout parasitic resistance and parasitic capacitance, the overall speed of the circuit is increased and the power consumption is reduced. Thus, in the inverter circuit 200, the layout parasitic resistance and parasitic capacitance in the critical paths of the inverter circuit may be reduced by creating an additional current path from the supply voltage signal 230 to the output signal 235 in the first p-type transistor 205 and the second p-type transistor 210, and an additional current path from the output to the ground voltage signal 255 in the first n-type transistor 215 and the second n-type transistor 220.

The additional current path may be created by optimizing transistor placement in a standard cell layout of the inverter circuit 200. The transistor placement may be optimized by creating a mega transistor that provides the additional current paths to reduce the layout parasitic resistance and parasitic capacitance. For example, in the inverter circuit 200, the first p-type transistor 205 and the second p-type transistor 210 may be combined to create a p-type mega transistor, and the first n-type transistor 215 and the second n-type transistor 220 may be combined to create an n-type mega transistor. The p-type mega transistor and the n-type mega transistor may then be placed instead of the first p-type transistor 205, the second p-type transistor 210, the first n-type transistor 215, and the second n-type transistor 220 in a standard cell layout, thereby reducing the layout parasitic resistance and parasitic capacitance and increasing the overall speed of the inverter circuit 200 while reducing the power consumption.

Figure 3:
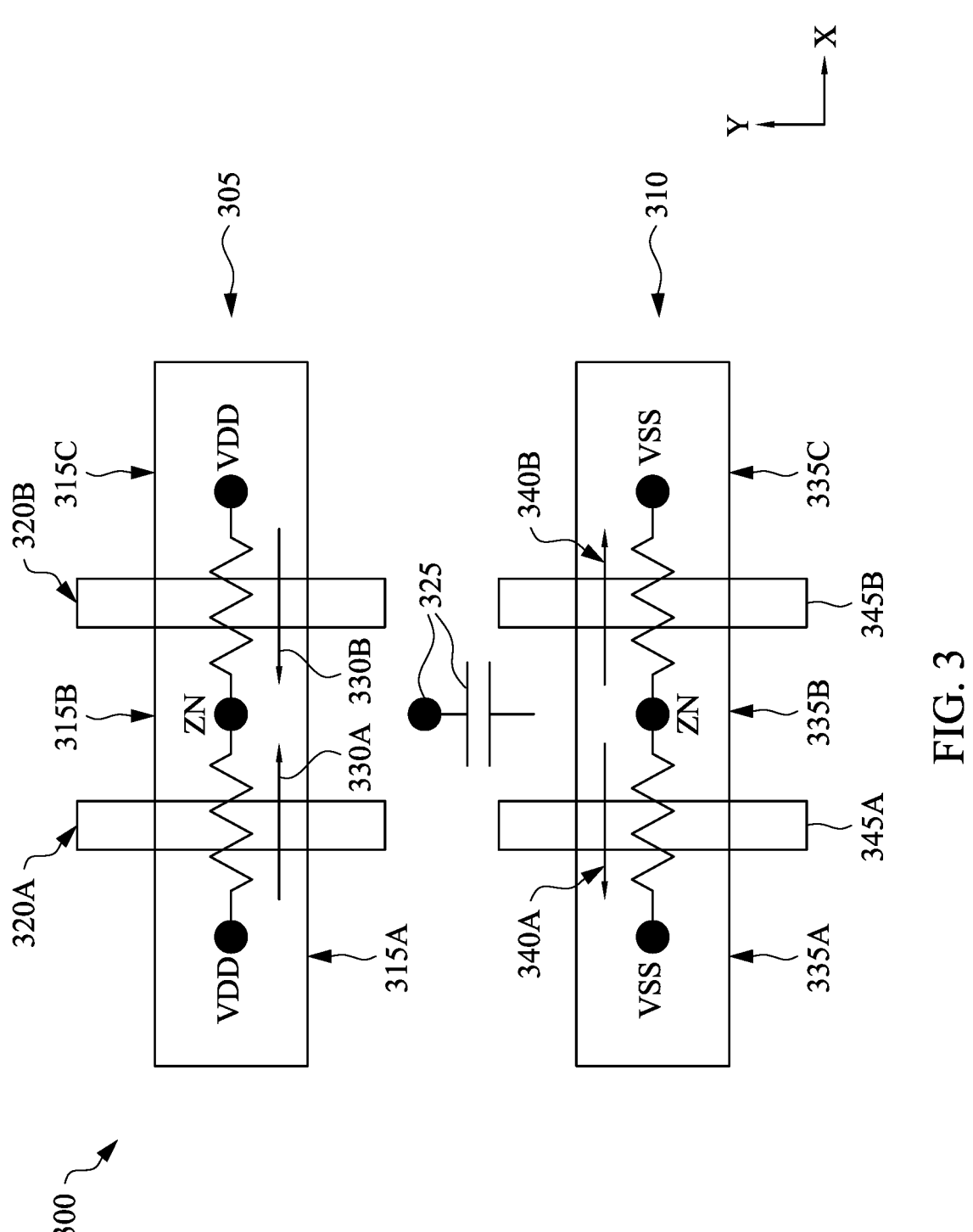
FIG. 3 is an example layout design of the inverter circuit of FIG. 2 having a mega transistor, in accordance with some embodiments.

Referring to FIG. 3 in conjunction with FIG. 2, an example layout design 300 of the inverter circuit 200 is shown, in accordance with some embodiments of the present disclosure. The layout design 300 includes the layout of a p-type mega transistor 305 formed from the first p-type transistor 205 and the second p-type transistor 210, as well as the layout for an n-type mega transistor 310 formed from the first n-type transistor 215 and the second n-type transistor 220. The p-type mega transistor 305 includes active regions 315A, 315B, and 315C, as well as polysilicon regions 320A and 320B. The active regions 315A-315C may be a fin-shaped region of one or more three-dimensional field-effect-transistors (e.g., FinFETs, gate-all-around (GAA) transistors), or an oxide-definition (OD) region of one or more planar metal-oxide-semiconductor field-effect-transistors (MOSFETs), such that the active region may serve as a source feature or drain feature of the respective transistor(s). The active regions 315A-315C may extend along a cell row direction, such as the X-direction.

The active region 315A corresponds to the semiconductor layer during fabrication where the first p-type source terminal 225A of the first p-type transistor 205 is formed. Thus, the active region 315A provides a connection to the supply voltage signal 230 (e.g., VDD) in the first p-type transistor 205 of the inverter circuit 200. The active region 315C corresponds to the semiconductor layer where the second p-type source terminal 245A of the second p-type transistor 210 is formed. Therefore, the active region 315C also provides a connection to the supply voltage signal 230 (e.g., VDD) in the second p-type transistor 210 of the inverter circuit 200.

The p-type mega transistor 305 also includes the active region 315B in which the first p-type drain terminal 225B of the first p-type transistor 205 and the second p-type drain terminal 245B of the second p-type transistor 210 are formed. Thus, the active region 315B is a common active region area for the first p-type drain terminal 225B and the second p-type drain terminal 245B. The active region 315B provides a connection to the output signal 235 (e.g., ZN) for both the first p-type drain terminal 225B and the second p-type drain terminal 245B. The common active region (e.g., the active region 315B) for the first p-type drain terminal 225B and the second p-type drain terminal 245B provides an additional charge current path from the supply voltage signal 230 to the output signal 235 in both the first p-type transistor 205 and the second p-type transistor 210. By providing an additional current path, the layout parasitic resistance may be reduced. Since the first p-type drain terminal 225B and the second p-type drain terminal 245B are formed in the common active region (e.g., the active region 315B), the p-type mega transistor 305 provides a common drain layout.

A common drain layout may be better than a common source layout. In the common source layout, the source terminals of two transistors are formed in a common active region. For example, in a common source layout for the inverter circuit 200, the active region 315A would be associated with the first p-type drain terminal 225B, the active region 315B would to associated with the first p-type source terminal 225A and the second p-type source terminal 245A, and the active region 315C would be associated with the second p-type drain terminal 245B. A common source layout is undesirable due to higher parasitic resistance between the supply voltage signal 230 and the output signal 235 (in a p-type transistor), as well as a higher parasitic resistance between the ground voltage signal 255 and the output signal (in an n-type transistor).

Additionally, in a common source layout, a longer interconnect metal is needed for the output signal 235 between the active region 315A (e.g., the first p-type drain terminal 225B) and the active region 315C (e.g., the second p-type drain terminal 245B), which increases the parasitic capacitance in the interconnect metal for the output signal 235. The length of the interconnect may be even longer in a multi-stage circuit where the output signal 235 is an intermediate output of a one stage and is input in to the next stage of the circuit. The increased parasitic resistance and parasitic capacitance degrades the speed of the circuit (e.g., the inverter circuit 200) and increases power consumption. Further, the common source layout increases the overall area needed for the standard cell layout. The disadvantages associated with a common source layout may be minimized (or substantially eliminated) by using a common drain layout.

Thus, in the common drain layout, the first p-type drain terminal 225B and the second p-type drain terminal 245B are formed in a common active region (e.g., the active region 315B), to form the p-type mega transistor 305. Further, by forming the first p-type drain terminal 225B and the second p-type drain terminal 245B in the active region 315B, the length of the interconnect metal for the output signal 235 between the first p-type drain terminal 225B and the second p-type drain terminal 245B is reduced, thereby reducing the parasitic capacitance in the interconnect metal for the output signal. The length of the interconnect metal for the output signal 235 and the associated parasitic capacitance is represented by reference numeral 325.

Further, by reducing the parasitic resistance and parasitic capacitance in the p-type mega transistor 305, the speed of the inverter circuit 200 may be increased and the power consumption may be reduced. The p-type mega transistor 305 also includes the polysilicon region 320A that corresponds to the semiconductor layer during fabrication of the inverter circuit 200 where the first p-type gate terminal 225C of the first p-type transistor 205 is formed, and the polysilicon region 320B that corresponds to the semiconductor layer where the second p-type gate terminal 245C of the second p-type transistor 210 is formed.

Thus, the p-type mega transistor 305 provides a common drain layout in which an additional current path is provided between the supply voltage signal 230 to the output signal 235 in the first p-type transistor 205 and the second p-type transistor 210, as represented by arrows 330A and 330B, to reduce the parasitic resistance and parasitic capacitance.

The n-type mega transistor 310 is created from two n-type transistors. The n-type mega transistor 310 includes active regions 335A, 335B, and 335C. The active region 335A corresponds to the semiconductor layer in which the first n-type source terminal 250A of the first n-type transistor 215 is formed. Thus, the active region 335A provides a connection to the first n-type transistor 215 from the ground voltage signal 255 (e.g., VSS). The active region 335C corresponds to the semiconductor layer in which the second n-type source terminal 260A of the second n-type transistor is formed during fabrication. Thus, the active region 335C provides a connection from the ground voltage signal 255 (e.g., VSS) to the second n-type transistor 220.

The active region 335B corresponds to the semiconductor layer in which the first n-type drain terminal 250B of the first n-type transistor 215 and the second n-type drain terminal 260B of the second n-type transistor 220 are formed. Therefore, the active region 335B provides a connection from the first n-type drain terminal 250B and the second n-type drain terminal 260B to the output signal 235 (e.g., ZN). Similar to the active region 315B, the active region 335B provides a common drain layout for the first n-type transistor 215 and the second n-type transistor 220. The active region 335B provides an additional discharge current path from the output signal 235 to the ground voltage signal 255, thereby reducing parasitic resistance, as shown by arrows 340A and 340B. Further, by forming the first n-type drain terminal 250B and the second n-type drain terminal 260B in the active region 335B, a shorter interconnect metal is needed for the output signal 235, thereby reducing the parasitic capacitance. By reducing the parasitic resistance and parasitic capacitance, the overall speed of the inverter circuit 200 is increased and the power consumption is reduced.

The n-type mega transistor 310 also includes polysilicon regions 345A and 345B. The polysilicon region 345A corresponds to the semiconductor layer in which the first n-type gate terminal 250C of the first n-type transistor 215 is formed during fabrication, while the polysilicon region 345B corresponds to the semiconductor layer in which the second n-type gate terminal 260C of the second n-type transistor 220 is formed.

Thus, as shown, the p-type mega transistor 305 and the n-type mega transistor 310 provide a common drain layout in which the drain terminals of two transistors (either two p-type or two n-type transistors) are formed in a common active region to provide an additional current path. The mega transistor (whether p-type or n-type) reduces parasitic resistance, reduces parasitic capacitance, increases circuit speed, and reduces power consumption in the circuit. Further, by reducing the length of the interconnect metal for the output signal 235, the mega transistor may also reduce an area (e.g., cell area) of the circuit (e.g., the inverter circuit 200).

Further, although not shown, the p-type mega transistor 305 and the n-type mega transistor 310 may be formed in accordance with one or more design rules and/or layout constraints. For example, in some embodiments, the design rules and/or layout constraints may define a minimum or maximum spacing between the various polysilicon regions, a minimum or maximum width of the various polysilicon regions, a minimum or maximum distance between two interconnect metal layers, etc. Although not shown, the p-type mega transistor 305 and the n-type mega transistor 310 are intended to encompass and implement such design rules and/or layout constraints that may be applicable. Such design rules and/or layout constraints may be stored within the memory array 145 of the memory device 110 and accessible to the standard cell layout application 135.

It is also to be understood again that the inverter circuit 200 is only an example and that the present disclosure may be applied to any circuit or semiconductor device in which a reduction in parasitic resistance and capacitance by providing an additional charge and discharge current path is desired. Further, although the p-type mega transistor 305 and the n-type mega transistor 310 are explained with respect to the inverter circuit 200, it is to be understood that mega transistors may similarly be formed in any circuit or semiconductor device. For example, a p-type mega transistor may be formed by forming the drain terminals of two p-type output transistors in a common diffusion region. Similarly, an n-type mega transistor may be formed by forming the drain terminals of two n-type transistors in a common diffusion region. Further, although the inverter circuit 200 has only two p-type output transistors and two n-type output transistors, some circuits and semiconductor devices may have more than two p-type or more than two n-type output transistors. In such embodiments, pairs of output transistors may be formed for forming one or more mega transistors. The transistors that form the pair may be selected based on a merging priority.

Figure 4:
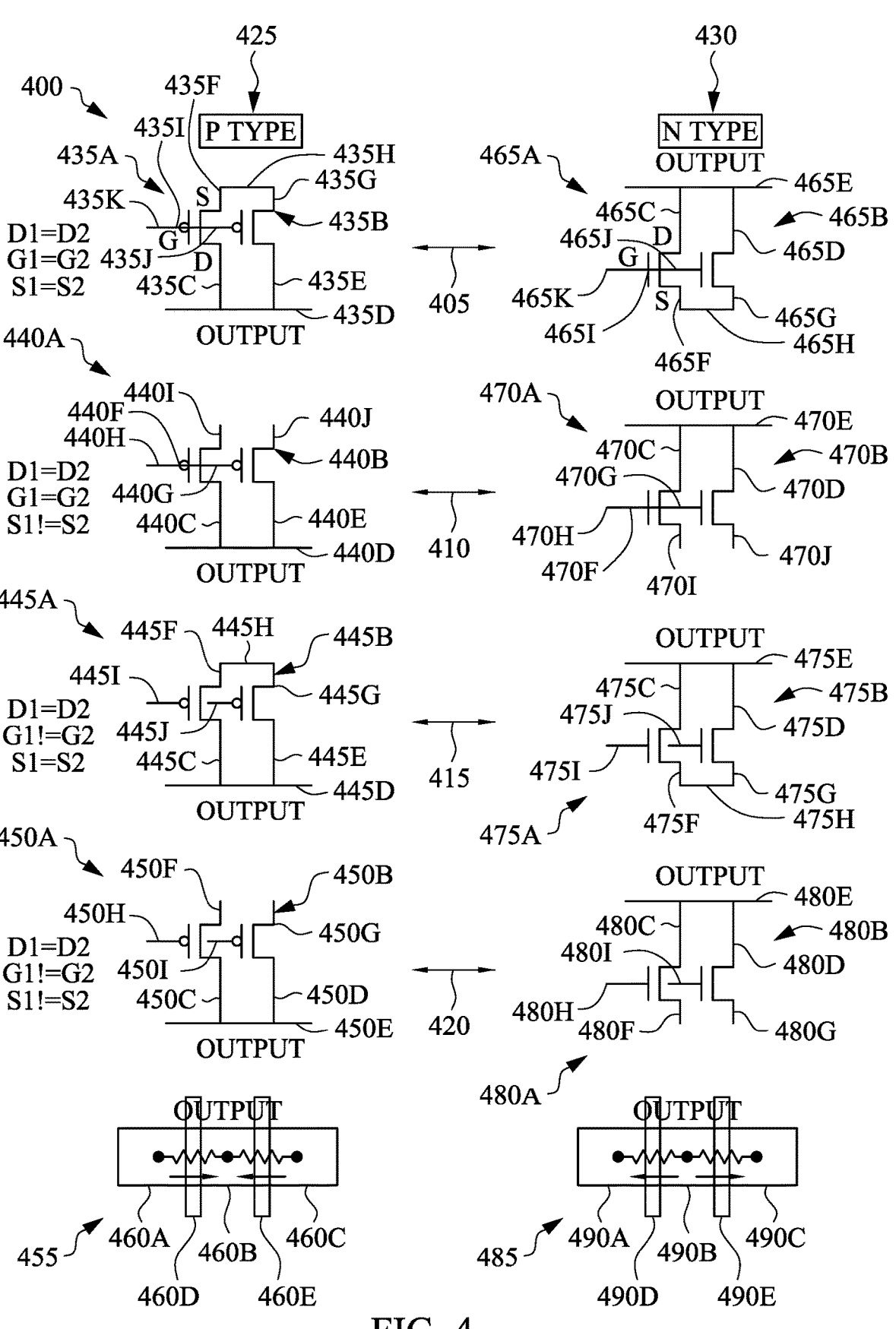
FIG. 4 is an block diagram showing a merging priority for selecting transistors to create a mega transistor, in accordance with some embodiments.

Turning now to FIG. 4, an example block diagram illustrating a merging priority 400 is shown, in accordance with some embodiments of the present disclosure. As discussed above, the drain terminals of two p-type output transistors or two n-type output transistors may be merged in a common active region to form a mega transistor. When more than two p-type output transistors or more than two n-type output transistors are found in a circuit, pairs of output transistors of the same type that are to be merged together are selected based on the merging priority 400. The merging priority 400 includes a first merging priority 405, a second merging priority 410, a third merging priority 415, and a fourth merging priority 420. The first merging priority 405 is the highest merging priority, followed by the second merging priority 410, then the third merging priority 415, and the fourth merging priority 420 is the lowest.

In other words, when two output transistors (either two p-type or two n-type output transistors) are found in a circuit that satisfy the first merging priority 405, those two output transistors are selected for creating a mega transistor. If no pairs of output transistors that satisfy the first merging priority 405 are found, then the circuit is evaluated for finding pairs of output transistors that satisfy the second merging priority 410 for creating a mega transistor. Similarly, if no pairs of output transistors are found that satisfy the second merging priority 410, then the circuit is evaluated for pairs of output transistors that satisfy the third merging priority 415 followed by the fourth merging priority 420 for forming a mega transistor.

The merging priority 400 is based upon the connection of the terminals of two output transistors of the same type. Thus, the p-type output transistors may be merged based upon a p-type merging priority 425 while the n-type output transistors may be merged based upon an n-type merging priority 430. The p-type merging priority 425 and the n-type merging priority 430 each include the first merging priority 405, the second merging priority 410, the third merging priority 415, and the fourth merging priority 420.

The first merging priority 405 in the p-type merging priority 425 includes a first p-type transistor 435A and a second p-type transistor 435B. The first p-type transistor 435A and the second p-type transistor 435B are each output transistors. In other words, a drain terminal ("D1") 435C of the first p-type transistor 435A is connected to an output signal 435D and a drain terminal ("D2") 435E of the second p-type transistor 435B is also connected to the output signal. Further, in the first merging priority 405, a source terminal ("S1") 435F of the first p-type transistor 435A and a source terminal ("S2") 435G of the second p-type transistor 435B is connected to a same first signal 435H. Also, in the first merging priority 405, a gate terminal ("G1") 435I of the first p-type transistor 435A and a gate terminal ("G2") 435J of the second p-type transistor 435B are connected to a same second signal 435K. Thus, the first p-type transistor 435A and the second p-type transistor 435B satisfy the first merging priority 405 when D1=D2, S1=S2, and G1=G2.

The second merging priority 410 in the p-type merging priority 425 includes a first p-type transistor 440A and a second p-type transistor 440B. The first p-type transistor 440A and the second p-type transistor 440B are each output transistors in which a drain terminal ("D1") 440C of the first p-type transistor is connected to an output signal 440D and a drain terminal ("D2") 440E of the second p-type transistor is also connected to the output signal. Further, in the second merging priority 410, a gate terminal ("G1") 440F of the first p-type transistor 440A and a gate terminal ("G2") 440G of the second p-type transistor 440B are connected to a same signal 440H. However, a source terminal ("S1") 440I of the first p-type transistor 440A and a source terminal ("S2") 440J of the second p-type transistor 440B are connected to different signals. Thus, the first p-type transistor 440A and the second p-type transistor 440B satisfy the second merging priority 410 when D1=D2, G1=G2, and S1!=S2.

The third merging priority 415 in the p-type merging priority 425 includes a first p-type transistor 445A and a second p-type transistor 445B. The first p-type transistor 445A and the second p-type transistor 445B are each output transistors in which a drain terminal ("D1") 445C of the first p-type transistor is connected to an output signal 445D and a drain terminal ("D2") 445E of the second p-type transistor is also connected to the output signal. Further, in the third merging priority 415, a source terminal ("S1") 445F of the first p-type transistor 445A and a source terminal ("S2") 445G of the second p-type transistor 445B are connected to a same signal 445H. However, a gate terminal ("G1") 445I of the first p-type transistor 445A and a gate terminal ("G2") 445J of the second p-type transistor 445B are connected to different signals. Thus, the first p-type transistor 445A and the second p-type transistor 445B satisfy the third merging priority 415 when D1=D2, S1=S2, and G1!=G2.

The fourth merging priority 420 in the p-type merging priority 425 includes a first p-type transistor 450A and a second p-type transistor 450B, both of which are output transistors. Thus, a drain terminal ("D1") 450C of the first p-type transistor 450A and a drain terminal ("D2") 450D of the second p-type transistor 450B are each connected to an output signal 450E. Further, a source terminal ("S1") 450F of the first p-type transistor 450A and a source terminal ("S2") 450G of the second p-type transistor 450B are connected to different signals, while a gate terminal ("G1") 450H of the first p-type transistor and a gate terminal ("G2") 450I of the second p-type transistor are connected to different signals. Thus, the first p-type transistor 450A and the second p-type transistor 450B satisfy the fourth merging priority 420 when D1=D2, S1!=S2, and G1!=G2.

The p-type merging priority 425 is summarized in Table 1 as follows:

TABLE 1

| | First P-Type Transistor (Terminals: D1, S1, G1) And Second P-Type Transistor (Terminals: D2, S2, G2) |
| --- | --- |
| First Merging Priority (Highest) | D1 = D2, S1 = S2, G1 = G2 |
| Second Merging Priority | D1 = D2, G1 = G2, S1! = S2 |
| Third Merging Priority | D1 = D2, S1 = S2, G1! = G2 |
| Fourth Merging Priority (Lowest) | D1 = D2, G1! = G2, S1! = S2 |

Two p-type transistors selected according to the p-type merging priority 425 above may be merged together to form a p-type mega transistor 455. Thus, the p-type mega transistor 455 includes a first p-type output transistor (e.g., the first p-type transistors 435A, 440A, 445A, 450A) and a second p-type output transistor (e.g., the second p-type transistors 435B, 440B, 445B, 450B) merged together in a common drain layout. The common drain layout of the p-type mega transistor 455 includes an active region 460A in which the source terminal (e.g., the source terminals 435F, 440I, 445F, 450F) of the first p-type output transistor (e.g., the first p-type transistors 435A, 440A, 445A, 450A) is formed, a common active region 460B in which the drain terminals (e.g., the drain terminals 435C, 435E, 440C, 440E, 445C, 445E, 450C, 450D) of the first p-type output transistor (e.g., the first p-type transistors 435A, 440A, 445A, 450A) and the second p-type output transistor (e.g., the second p-type transistors 435B, 440B, 445B, 450B) are formed to provide an additional current path from the supply voltage signal to the output signal, and an active region 460C in which the source terminal (e.g., the source terminals 435G, 440J, 445G, 450G) of the second p-type output transistor (e.g., the second p-type transistors 435B, 440B, 445B, 450B) is formed.

The p-type mega transistor 455 also includes a polysilicon region 460D corresponding to a gate terminal (e.g., the gate terminals 435K, 440F, 445I, 450H) of the first p-type output transistor (e.g., the first p-type transistors 435A, 440A, 445A, 450A) and a polysilicon region 460E corresponding to a gate terminal (e.g., the gate terminals 435J, 440G, 445J, 450I) of the second p-type output transistor (e.g., the second p-type transistors 435B, 440B, 445B, 450B). Thus, the p-type mega transistor 455 may be formed by combining the drain terminals of two p-type output transistors in a common active region (e.g., the common active region 460B) regardless of the merging priority of those p-type output transistors.

Referring still to FIG. 4, the terminal connections forming the first merging priority 405, the second merging priority 410, the third merging priority 415, and the fourth merging priority 420 are same in the n-type merging priority 430 as in the p-type merging priority 425 but with n-type transistors. Thus, the first merging priority 405 in the n-type merging priority 430 includes a first n-type transistor 465A and a second n-type transistor 465B. The first n-type transistor 465A and the second n-type transistor 465B are each output transistors having a drain terminal ("D1") 465C and a drain terminal ("D2") 465D, respectively, connected to an output signal 465E. Further, a source terminal ("S1") 465F of the first n-type transistor 465A and a source terminal ("S2") 465G of the second n-type transistor 465B are connected to a same first signal 465H, while a gate terminal ("G1") 465I of the first n-type transistor and a gate terminal ("G2") 465J of the second n-type transistor are connected to a same second signal 465K. Thus, the first n-type transistor 465A and the second n-type transistor 465B satisfy the first merging priority 405 when D1=D2, S1=S2, and G1=G2.

The second merging priority 410 in the n-type merging priority 430 includes a first n-type transistor 470A and a second n-type transistor 470B, both of which are output transistors. Thus, a drain terminal ("D1") 470C of the first n-type transistor 470A and a drain terminal ("D2") 470D of the second n-type transistor 470B are connected to an output signal 470E. Further, a gate terminal ("G1") 470F of the first n-type transistor 470A and a gate terminal ("G2") 470G of the second n-type transistor 470B are connected to a same signal 470H. However, a source terminal ("S1") 470I of the first n-type transistor 470A and a source terminal ("S2") 470J of the second n-type transistor 470B are connected to different signals. Thus, the first n-type transistor 470A and the second n-type transistor 470B satisfy the second merging priority 410 when D1=D2, G1=G2, and S1!=S2.

The third merging priority 415 in the n-type merging priority 430 includes a first n-type transistor 475A and a second n-type transistor 475B, each of which is an output transistor. A drain terminal ("D1") 475C of the first n-type transistor and a drain terminal ("D2") 475D of the second n-type transistor 475B are connected to an output signal 475E, and a source terminal ("S1") 475F of the first n-type transistor and a source terminal ("S2") 475G of the second n-type transistor are connected to a same signal 475H. However, a gate terminal ("G1") 475I of the first n-type transistor 475A and a gate terminal ("G2") 475J of the second n-type transistor 475B are connected to different signals. Thus, the first n-type transistor 475A and the second n-type transistor 475B satisfy the third merging priority 415 when D1=D2, S1=S2, and G1!=G2.

The fourth merging priority 420 in the n-type merging priority 430 includes a first n-type transistor 480A and a second n-type transistor 480B, both of which are output transistors. Thus, a drain terminal ("D1") 480C of the first n-type transistor 480A and a drain terminal ("D2") 480D of the second n-type transistor 480B are each connected to an output signal 480E. Further, a source terminal ("S1") 480F of the first n-type transistor 480A and a source terminal ("S2") 480G of the second n-type transistor 480B are connected to different signals, while a gate terminal ("G1") 480H of the first n-type transistor and a gate terminal ("G2") 480I of the second n-type transistor are connected to different signals. Thus, the first n-type transistor 480A and the second n-type transistor 480B satisfy the fourth merging priority 420 when D1=D2, S1!=S2, and G1!=G2.

The n-type merging priority 430 may be summarized in Table 2 as follows:

TABLE 2

| | First N-Type Transistor (Terminals: D1, S1, G1) And Second N-Type Transistor (Terminals: D2, S2, G2) |
| --- | --- |
| First Merging Priority (Highest) | D1 = D2, S1 = S2, G1 = G2 |
| Second Merging Priority | D1 = D2, G1 = G2, S1! = S2 |
| Third Merging Priority | D1 = D2, S1 = S2, G1! = G2 |

TABLE 2-continued

| | First N-Type Transistor (Terminals: D1, S1, G1) And Second N-Type Transistor (Terminals: D2, S2, G2) |
| --- | --- |
| Fourth Merging Priority (Lowest) | D1 = D2, G1! = G2, S1! = S2 |

Further, the n-type transistors in any of the first merging priority 405, the second merging priority 410, the third merging priority 415, and the fourth merging priority 420 may be combined together to form an n-type mega transistor 485. The n-type mega transistor 485 includes a first n-type output transistor (e.g., the first n-type transistors 465A, 470A, 475A, 480A) and a second n-type output transistor (e.g., the second n-type transistors 465B, 470B, 475B, 480B) merged together in a common drain layout. The common drain layout of the n-type mega transistor 485 includes an active region 490A for the source terminal (e.g., the source terminals 465F, 470I, 475F, 480F) of the first n-type output transistor (e.g., the first n-type transistors 465A, 470A, 475A, 480A), a common active region 490B for the drain terminals (e.g., the drain terminals 465C, 465D, 470C, 470D, 475C, 475D, 480C, 480D) of the first n-type output transistor (e.g., the first n-type transistors 465A, 470A, 475A, 480A) and the second n-type output transistor (e.g., the second n-type transistors 465B, 470B, 475B, 480B), and an active region 490C for the source terminal (e.g., the source terminals 465G, 470J, 475G, 480G) of the second n-type output transistor (e.g., the second n-type transistors 465B, 470B, 475B, 480B). The mega transistor 285 also includes a polysilicon region 490D for the gate terminal (e.g., the gate terminals 465I, 470F, 475I, 480H) of the first n-type output transistor (e.g., the first n-type transistors 465A, 470A, 475A, 480A) and a polysilicon region 490E for the gate terminal (e.g., the gate terminals 465J, 470G, 475J, 480I) of the second n-type output transistor (e.g., the second n-type transistors 465B, 470B, 475B, 480B). Thus, the n-type mega transistor 285 may be formed by merging the drain terminals of two n-type output transistors in a common active region regardless of the merging priority of those n-type output transistors.

Figure 6:
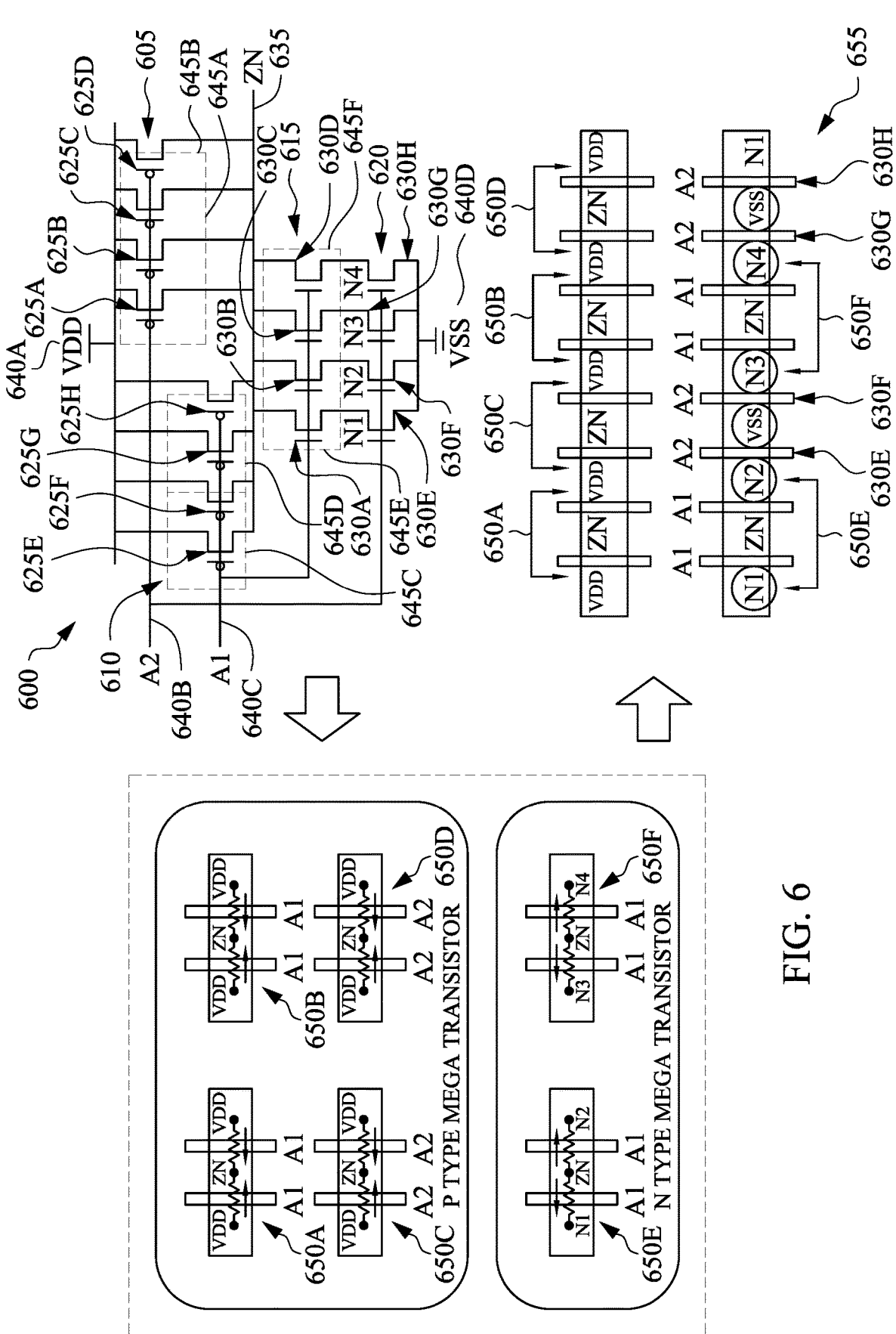
FIG. 6 is an example block diagram of a circuit and its corresponding layout design, in accordance with some embodiments.

Referring to FIG. 5, an example flowchart outlining a process 500 for performing a standard cell layout using a mega transistor is shown, in accordance with some embodiments of the present disclosure. The process 500 may include additional or other operations, depending upon the particular embodiment. The process 500 may be implemented by executing the standard cell layout application 135. Further, the process 500 may be repeated for each stage of a circuit. Thus, for a multi-stage circuit, the process 500 may be performed for each stage of the circuit. The process 500 starts at an operation 505 when a standard cell layout of a circuit is to be performed. For purposes of explanation, the process 500 is discussed in conjunction with an example circuit 600 of FIG. 6. It is to be understood that the circuit 600 is only an example and that the process 500 may be implemented in other circuits and semiconductor devices. Thus, the process 500 may be performed when a standard cell layout design for a circuit (e.g., the circuit 600) is to be created.

At operation 505, a transistor level circuit (e.g., the circuit 600) may be created and at operation 510, a transistor netlist of the circuit 600 may be developed using a standard cell library. The transistor netlist provides a list of electrical components (e.g., transistors) in the circuit 600 and the list of nodes or signals that each electrical component is connected to. For example, the netlist may define the input, output, and intermediary nodes (or signals) that each transistor in the circuit 600 is connected to. With respect to the circuit 600, that circuit includes a first group 605 of p-type transistors, a second group 610 of p-type transistors, a third group 615 of n-type transistors, and a fourth group 620 of n-type transistors. The first group 605 includes a first p-type transistor 625A, a second p-type transistor 625B, a third p-type transistor 625C, and a fourth p-type transistor 625D. The second group 610 includes a fifth p-type transistor 625E, a sixth p-type transistor 625F, a seventh p-type transistor 625G, and an eighth p-type transistor 625H. The third group 615 includes a first n-type transistor 630A, a second n-type transistor 630B, a third n-type transistor 630C, and a fourth n-type transistor 630D. The fourth group 620 includes a fifth n-type transistor 630E, a sixth n-type transistor 630F, a seventh n-type transistor 630G, and an eighth n-type transistor 630H.

Drain terminals of each of the p-type transistors (e.g., the first p-type transistor 625A, the second p-type transistor 625B, the third p-type transistor 625C, and the fourth p-type transistor 625D) in the first group 605 are connected to an output signal 635. Similarly, the drain terminals of each of the p-type transistors (e.g., the fifth p-type transistor 625E, the sixth p-type transistor 625F, the seventh p-type transistor 625G, and the eighth p-type transistor 625H) in the second group 610 are connected to the output signal 635. The drain terminals of the n-type transistors (e.g., the first n-type transistor 630A, the second n-type transistor 630B, the third n-type transistor 630C, and the fourth n-type transistor 630D) in the third group 615 are also connected to the output signal 635. However, the drain terminals of the n-type transistors (e.g., the fifth n-type transistor 630E, the sixth n-type transistor 630F, the seventh n-type transistor 630G, and the eighth n-type transistor 630H) in the fourth group 620 are not connected to the output signal 635. Rather, the drain terminals of the n-type transistors in the fourth group 620 are connected to the source terminals of a respective one of an n-type transistor in the third group 615.

Further, in the circuit 600, the source terminal of each of the first p-type transistor 625A, the second p-type transistor 625B, the third p-type transistor 625C, and the fourth p-type transistor 625D is connected to a supply voltage signal 640A, and the gate terminal of each of those transistors is connected to a first input signal ("A2") 640B. The source terminal of each of the fifth p-type transistor 625E, the sixth p-type transistor 625F, the seventh p-type transistor 625G, and the eighth p-type transistor 625H is also connected to the supply voltage signal 640A, while the gate terminal of each of those transistors is connected to a second input signal ("A1") 640C. The source terminal of each of the first n-type transistor 630A, the second n-type transistor 630B, the third n-type transistor 630C, and the fourth n-type transistor 630D is connected to the drain terminal of the fifth n-type transistor 630E, the sixth n-type transistor 630F, the seventh n-type transistor 630G, and the eighth n-type transistor 630H, respectively. The gate terminal of each of the first n-type transistor 630A, the second n-type transistor 630B, the third n-type transistor 630C, and the fourth n-type transistor 630D is connected to the second input signal 640C. The source terminal of each of the fifth n-type transistor 630E, the sixth n-type transistor 630F, the seventh n-type transistor 630G, and the eighth n-type transistor 630H is connected to a ground voltage (VSS) 640D, and the gate terminal of each of those transistors is connected to the first input signal 640B.

The netlist for the circuit 600 may thus include the first p-type transistor 625A, the second p-type transistor 625B, the third p-type transistor 625C, the fourth p-type transistor 625D, fifth p-type transistor 625E, the sixth p-type transistor 625F, the seventh p-type transistor 625G, the eighth p-type transistor 625H, the first n-type transistor 630A, the second n-type transistor 630B, the third n-type transistor 630C, the fourth n-type transistor 630D, the fifth n-type transistor 630E, the sixth n-type transistor 630F, the seventh n-type transistor 630G, and the eighth n-type transistor 630H, and the signals (e.g., the output signal 635, the supply voltage signal 640A, the first input signal 640B, second input signal 640C, and the ground voltage signal 640D) that the various terminals of each of those transistors are connected to. Thus, the netlist defines the connectivity of the circuit 600. In some embodiments, the netlist may be generated using the standard cell layout application 135.

Upon developing the netlist for the circuit 600, an analysis of the netlist may be performed at operations 515 and 520. Specifically, the netlist may include a plurality of "nets." Each net may include one or more electrical components (e.g., transistors) that are interconnected together to form a connection path. For example, in the circuit 600, one net of the netlist may include the first n-type transistor 630A and the fifth n-type transistor 630E, as well as the various signals that those transistors are connected to, such as the output signal 635, the ground voltage signal 640D, the first input signal 640B, and the second input signal 640C. Similarly, the circuit 600 may include other nets. At the operation 515, output nets from the netlist are identified. An output net is a connection path that is connected to an output node or output signal. Depending upon the number of stages in the circuit, the output node or output signal may be the final or overall output of the circuit or an intermediate output of the circuit. For example, for a single stage circuit, an output net may be connected to a final output of the circuit. For a multiple stage circuit, an output net may be connected to an output of a particular stage. Thus, for the circuit 600 which is a single stage circuit, the nets that are connected to the output signal 635 may be considered an output net. The output nets may be identified from the netlist that is created at the operation 510.

At the operation 520, each of the output nets identified at the operation 515 is analyzed to identify the output transistors in that output net. As discussed above, an output transistor is a transistor whose drain terminal is directly connected to an output node or signal. For example, in the circuit 600, any transistors that have their drain terminal directly connected to the output signal 635 is an output transistor. Thus, for example, the first p-type transistor 625A, the second p-type transistor 625B, the third p-type transistor 625C, the fourth p-type transistor 625D, the fifth p-type transistor 625E, the sixth p-type transistor 625F, and the eighth p-type transistor 625H each have their respective drain terminals connected to the output signal 635. Therefore, each of the p-type transistors in the circuit 600 is an output transistor. Similarly, the first n-type transistor 630A, the second n-type transistor 630B, the third n-type transistor 630C, and the fourth n-type transistor 630D each has its drain terminal directly connected to the output signal 635. Thus, each of these n-type transistors in the third group 615 is an output transistor. However, drain terminals of the fifth n-type transistor 630E, the sixth n-type transistor 630F, the seventh n-type transistor 630G, and the eighth n-type transistor 630H are connected to the source terminals of the first n-type transistor 630A, the second n-type transistor 630B, the third n-type transistor 630C, and the fourth n-type transistor 630D, respectively, not to the output signal 635. Thus, the fifth n-type transistor 630E, the sixth n-type transistor 630F, the seventh n-type transistor 630G, and the eighth n-type transistor 630H are not output transistors.

Upon identifying the output transistors at the operation 520, pairs of output transistors are identified for creating one or more mega transistors at operation 525. Thus, at the operation 525, the output transistors may be analyzed to identify which, if any, pairs satisfy one of the merging priority 400. For example, in the circuit 600, the first p-type transistor 625A and the second p-type transistor 625B satisfy the first merging priority 405 because their respective drain terminals are connected to the output signal 635, their respective source terminals are connected to the same signal (e.g., the supply voltage signal 640A) and their respective gate terminals are connected to the same signal (e.g., the first input signal 640B). Thus, the first p-type transistor 625A and the second p-type transistor 625B may be paired together for creating a mega transistor, as shown by dashed box 645A. Similarly, the third p-type transistor 625C and the fourth p-type transistor 625D satisfy the first merging priority 405 and may be paired for creating another mega transistor, as represented by dashed box 645B.

Likewise, the fifth p-type transistor 625E and the sixth p-type transistor 625F satisfy the first merging priority 405 because their respective drain terminals are connected to the output signal 635, their respective source terminals are connected to the same signal (e.g., the supply voltage signal 640A) and their respective gate terminals are connected to the same signal (e.g., the second input signal 640C). Thus, the fifth p-type transistor 625E and the sixth p-type transistor 625F may be paired together, as represented by dashed box 645C, to create a mega transistor. Similarly, the seventh p-type transistor 625G and the eighth p-type transistor 625H satisfy the first merging priority 405 and may be paired, as represented by dashed box 645D, to create a mega transistor.

The first n-type transistor 630A and the second n-type transistor 630B do not satisfy the first merging priority because although their respective drain terminals are connected to the output signal 635, and their respective gate terminals are connected to the same signal (e.g., the second input signal 640C), their respective source terminals are not connected to the same signal. Rather, the source terminal of the first n-type transistor 630A is connected to the drain terminal of the fifth n-type transistor 630E and the source terminal of the second n-type transistor 630B is connected to the drain terminal of the sixth n-type transistor 630F. Thus, the source terminals of the first n-type transistor 630A and the second n-type transistor 630B are connected to different signals. Even though the first n-type transistor 630A and the second n-type transistor 630B do not satisfy the first merging priority 405, those transistors still satisfy the second merging priority 410, and may be selected for creating a mega transistor, as represented by dashed box 645E. Similarly, the third n-type transistor 630C and the fourth n-type transistor 630D satisfy the second merging priority, and may be designated for creating a mega transistor, as indicated by dashed box 645F.

Thus, in the circuit 600, six mega transistors may be created (one each represented by the dashed boxes 645A, 645B, 645C, 645D, 645E, and 645F). Creation of one mega transistor is based on two output transistors of the same type. If an odd number of output transistors are in the circuit, then at least some of the transistors may not have another transistor to create a pair with, and therefore, may not be suitable for a mega transistor. For example, if the first group 605 has three p-type transistors, two of those three p-type transistors may be combined to create a mega transistor (if at least one of the merging priority is satisfied), but the third transistor may not have a transistor with which to pair. Thus, a mega transistor may not be created for the third transistor. In some embodiments, more than two transistors may be merged together to form a mega transistor by providing a common active region region for the drain terminals of the transistors being merged.

Upon identifying the pairs of output transistors at the operation 525 to create a mega transistor, at operation 530, a mega transistor is created for each pair. For example, in the circuit 600, six pairs of output transistors are identified at the operation 525 for creating a mega transistor. Thus, at the operation 530, six mega transistors are created. For creating a mega transistor for a pair having a first transistor and a second transistor, the drain terminal of the first transistor and the drain terminal of the second transistor may be merged in a common drain layout. Thus, in the circuit 600, a first mega transistor 650A may be created for the fifth p-type transistor 625E and the sixth p-type transistor 625F, a second mega transistor 650B may be created for the seventh p-type transistor 625G and the eighth p-type transistor 625H, a third mega transistor 650C may be created for the first p-type transistor 625A and the second p-type transistor 625B, and a fourth mega transistor 650D may be created for the third p-type transistor 625C and the fourth p-type transistor 625D.

Similarly, a mega transistor 650E may be created for the first n-type transistor 630A and the second n-type transistor 630B, while a mega transistor 650F may be created for the third n-type transistor 630C and the fourth n-type transistor 630D. Each of the mega transistors 650A, 650B, 650C, and 650D is similar to the p-type mega transistor 455, and therefore not described again. Further, each of the mega transistors 650E and 650F is similar to the n-type mega transistor 485, and therefore not described again. At operation 535, a standard cell layout may be created using the mega transistors 650A-650F created at the operation 530.

For example, instead of the individual p-type transistors (e.g., the first p-type transistor 625A, the second p-type transistor 625B, the third p-type transistor 625C, the fourth p-type transistor 625D, the fifth p-type transistor 625E, the sixth p-type transistor 625F, the seventh p-type transistor 625G, and the eighth p-type transistor 625H), their corresponding mega transistors (e.g., the mega transistors 650A, 650B, 650C, and 650D) may be placed, as shown, in a standard cell layout 655 for the circuit 600. Similarly, instead of the individual n-type transistors (e.g., the first n-type transistor 630A, the second n-type transistor 630B, the third n-type transistor 630C, and the fourth n-type transistor 630D), their corresponding mega transistors (e.g., the mega transistor 650E and 650F) may be placed on the standard cell layout 655. However, since the fifth n-type transistor 630E, the sixth n-type transistor 630F, the seventh n-type transistor 630G, and the eighth n-type transistor 630H are not combined to create mega transistors, those transistors may be individually placed on the standard cell layout 655. For simplicity of explanation, the fifth n-type transistor 630E, the sixth n-type transistor 630F, the seventh n-type transistor 630G, and the eighth n-type transistor 630H are identified in the standard cell layout 655 by their respective polysilicon regions.

Thus, pairs of output transistors of the same type may be combined to create mega transistors, which may then be used in the standard cell layout to reduce parasitic resistance, parasitic capacitance, increase circuit speed, reduce power consumption, as well reduce cell area of the circuit. The process 500 ends at operation 540. Again, it is to be understood that the circuit 600 is only an example. The process 500 may be used for any circuit or semiconductor device in which creation of mega transistors is desirable.

Figure 7:
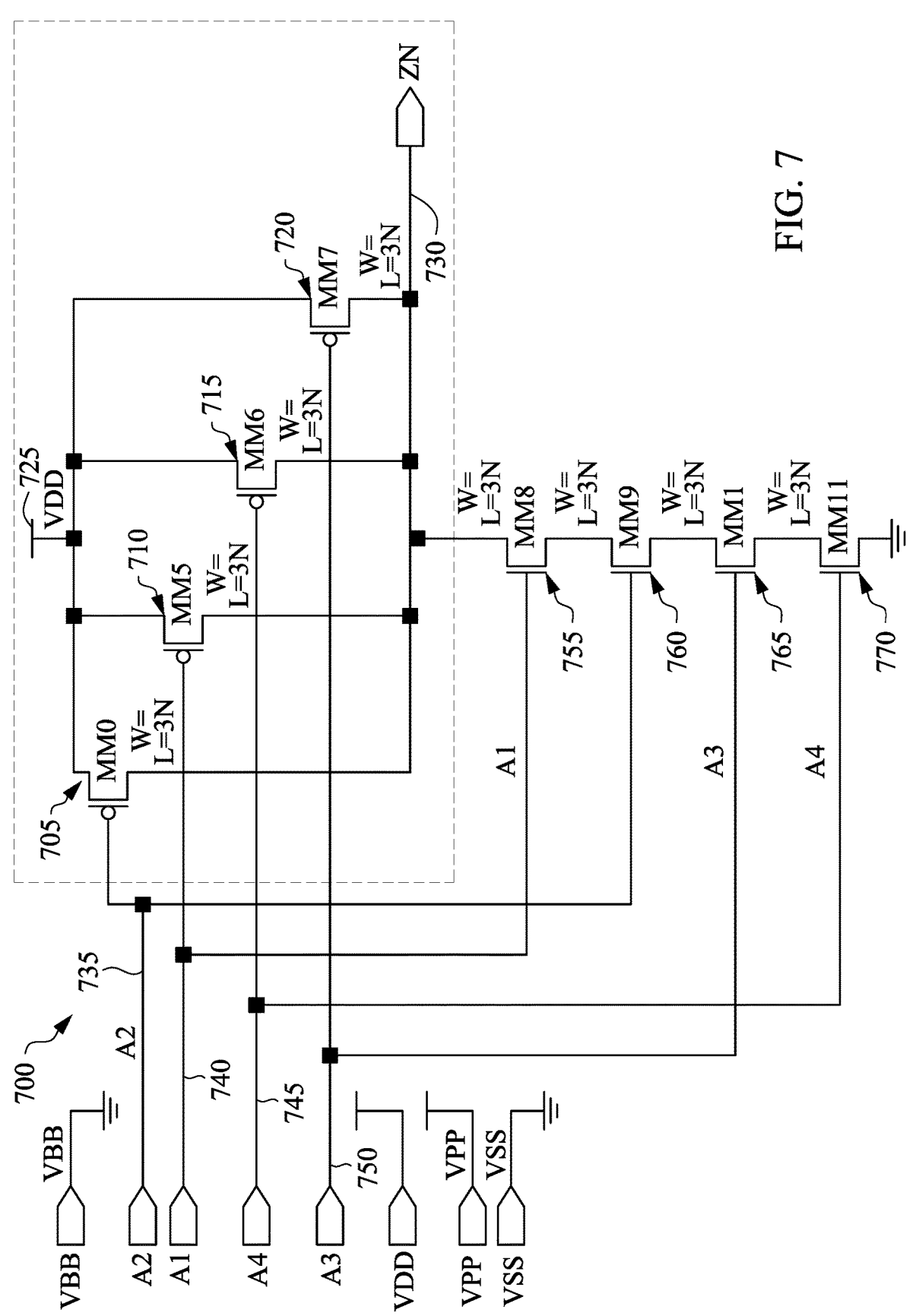
FIG. 7 is an example single stage circuit showing transistor selection for forming mega transistors, in accordance with some embodiments.

Turning now to FIG. 7, an example circuit 700 is shown, in accordance with some embodiments of the present disclosure. The circuit 700 is a single stage circuit. The circuit 700 is only an example to explain the selection of transistors for creating one or more mega transistors. The circuit 700 is not intended to be limiting in any way. The circuit 700 includes a first p-type transistor 705, a second p-type transistor 710, a third p-type transistor 715, and a fourth p-type transistor 720. The source terminal of each of the first p-type transistor 705, the second p-type transistor 710, the third p-type transistor 715, and the fourth p-type transistor 720 is connected to a supply voltage signal 725, while the drain terminal of each of those transistors is connected to an output signal 730. Further, the gate terminal of each of the first p-type transistor 705, the second p-type transistor 710, the third p-type transistor 715, and the fourth p-type transistor 720 is connected to a separate input signal. For example, the gate terminal of the first p-type transistor 705 is connected to a first input signal 735, the gate terminal of the second p-type transistor 710 is connected to a second input signal 740, the gate terminal of the third p-type transistor 715 is connected to a third input signal 745, and the gate terminal of the fourth p-type transistor 720 is connected to a fourth input signal 750.

Further, since the drain terminal of each of the first p-type transistor 705, the second p-type transistor 710, the third p-type transistor 715, and the fourth p-type transistor 720 is connected to the output signal 730, each of those transistors is an output transistor. Pairs of those transistors may be analyzed according to the merging priority 400 to determine which of those transistors may be merged to form a mega transistor. For example, the first p-type transistor 705 may be analyzed with the second p-type transistor 710 to check which merging priority (e.g., the first merging priority 405, the second merging priority 410, the third merging priority 415, or the fourth merging priority 420) is satisfied by that pair of transistors. Since the source terminal of each of the first p-type transistor 705 and the second p-type transistor 710 is connected to the same signal (e.g., the supply voltage signal 725), the drain terminal of each of those transistors is connected to the same signal (e.g., the output signal 730), but the gate terminal of each of those transistors is connected to a different signal, those transistors satisfy the third merging priority 415.

The first p-type transistor 705 may then be analyzed with the third p-type transistor 715 and the fourth p-type transistor 720 to check if the first p-type transistor has a higher merging priority (e.g., the first merging priority 405 or the second merging priority 410) with the third p-type transistor or the fourth p-type transistor than with the second p-type transistor 710. The first p-type transistor 705 and the third p-type transistor 715, and the first p-type transistor and the fourth p-type transistor 720 also satisfy the third merging priority. Thus, the first p-type transistor 705 may be merged with either the second p-type transistor 710, the third p-type transistor 715, or the fourth p-type transistor 720. Similarly, the second p-type transistor 710, the third p-type transistor 715, and the fourth p-type transistor 720 may be analyzed to identify another transistor of the same type having the highest merging priority to form a pair and create a mega transistor.

The circuit 700 also includes a first n-type transistor 755, a second n-type transistor 760, a third n-type transistor 765, and a fourth n-type transistor 770. Since the first n-type transistor 755, the second n-type transistor 760, the third n-type transistor 765, and the fourth n-type transistor 770 are daisy chained together, only the first n-type transistor is an output transistor. Since the drains of the second n-type transistor 760, the third n-type transistor 765, and the fourth n-type transistor 770 are not connected to the output signal 730, those transistors may not be considered an output transistor. Further, since there is a single n-type output transistor (e.g., the first n-type transistor 755) in the circuit 700, that n-type transistor may not be merged with another n-type transistor (which are not output transistors) to create a mega transistor. Thus, in the standard cell layout, each of the first n-type transistor 755, the second n-type transistor 760, the third n-type transistor 765, and the fourth n-type transistor 770 may need to be used individually.

By creating mega transistors from the first p-type transistor 705, the second p-type transistor 710, the third p-type transistor 715, and the fourth p-type transistor 720, and using those mega transistors in the standard cell layout of the circuit 700, inventors found that the speed of that circuit increased by at least 5% and the power consumption reduced by at least 5% without impacting the cell area of the circuit.

Figure 8:
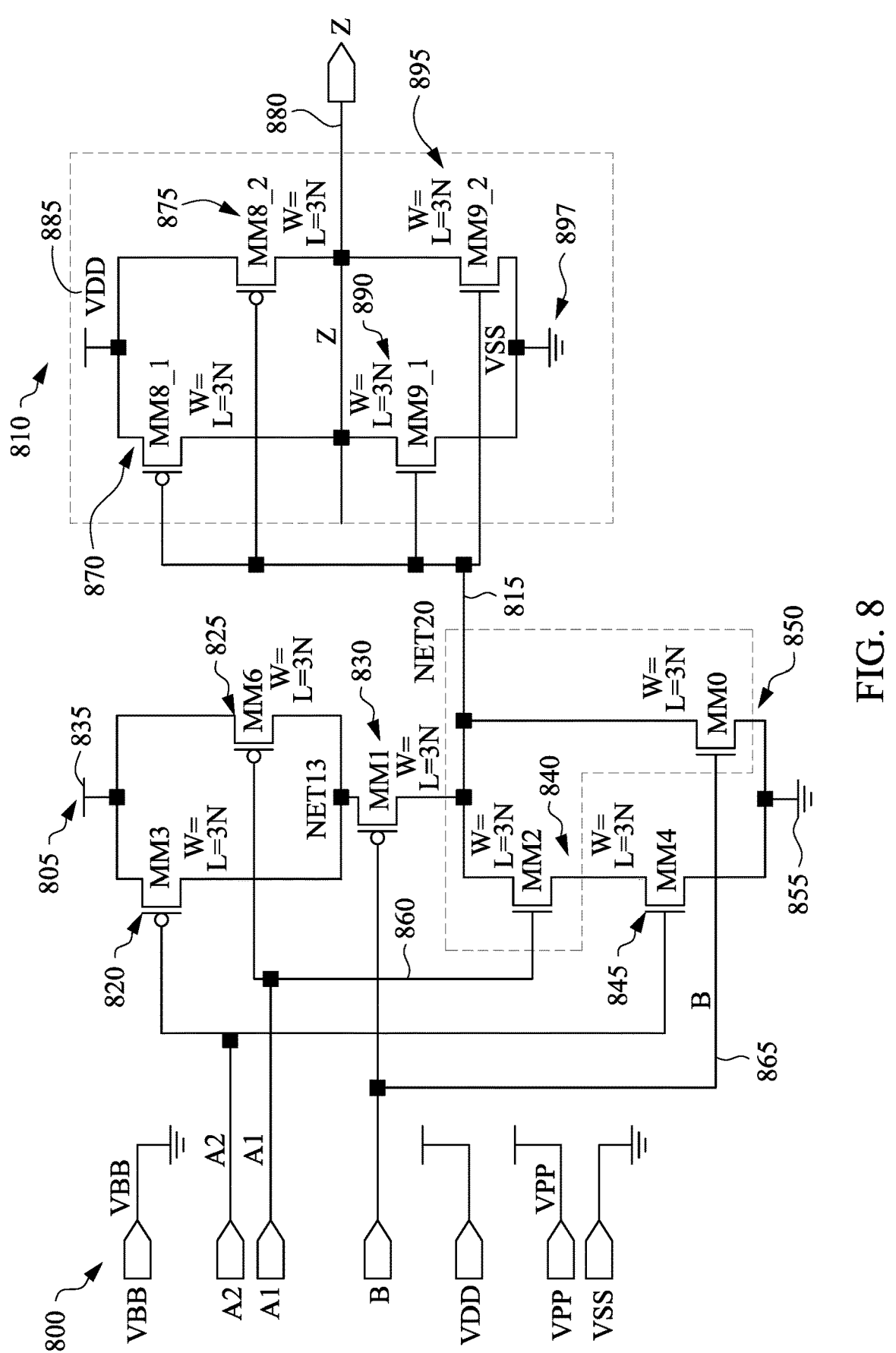
FIG. 8 is an example two stage circuit showing transistor selection for forming mega transistors, in accordance with some embodiments.

Referring now to FIG. 8, an example circuit 800 is shown, in accordance with some embodiments of the present disclosure. The circuit 800 is a 2-stage circuit. The circuit 800 is only an example to explain the selection of transistors for creating one or more mega transistors. The circuit 800 is not intended to be limiting in any way. The circuit 800 includes a first stage 805 and a second stage 810. An output signal 815 is an output from the first stage 805 and is provided as input into the second stage 810. The process 500 discussed above may be performed for the first stage 805 and then repeated for the second stage 810 for performing standard cell layout using mega transistors. For the first stage 805, the output signal 815 may be used to identify output transistors. The first stage 805 includes a first p-type transistor 820, a second p-type transistor 825, and a third p-type transistor 830.

The source terminal of the first p-type transistor 820 and the second p-type transistor 825 is connected to a voltage supply signal 835 and the source terminal of the third p-type transistor 830 is connected to the drain terminals of the first p-type transistor and the second p-type transistor. The drain terminal of the third p-type transistor 830 is connected to the output signal 815. Thus, between the first p-type transistor 820, the second p-type transistor 825, and the third p-type transistor 830, the drain terminal of only the third p-type transistor is connected to the output signal 815. Therefore, only the third p-type transistor 830 is an output transistor. Since the third p-type transistor 830 does not have any other p-type output transistor in the first stage 805 to pair with, no mega transistors may be created from the first p-type transistor 820, the second p-type transistor 825, and the third p-type transistor.

The first stage 805 also includes a first n-type transistor 840, a second n-type transistor 845, and a third n-type transistor 850. The source terminal of the second n-type transistor 845 and the third n-type transistor 850 is connected to a ground voltage signal 855, the drain terminal of the third n-type transistor is connected to the output signal 815, while the drain terminal of the second n-type transistor is connected to the source terminal of the first n-type transistor 840. The drain terminal of the first n-type transistor 840 is also connected to the output signal 815. Thus, in the first stage 805 of the circuit 800, the first n-type transistor 840 and the third n-type transistor 850 have their respective drain terminals connected to the output signal 815, and are thus an output transistor. Since there are only two n-type output transistors (e.g., the first n-type transistor 840 and the third n-type transistor 850), those n-type transistors may be combined to form a mega transistor if any of the merging priority 400 are satisfied.

For example, the drain terminals of the first n-type transistor 840 and the third n-type transistor 850 are connected to the same signal (e.g., the output signal 815). However, the source terminal of the first n-type transistor 840 and the third n-type transistor 850 are connected to different signals. For example, the source terminal of the first n-type transistor 840 is connected to the drain terminal of the second n-type transistor 845, while the source terminal of the third n-type transistor 850 is connected to the ground voltage signal 855. Similarly, the gate terminal of the first n-type transistor 840 and the third n-type transistor 850 are connected to different signals. For example, the gate terminal of the first n-type transistor 840 is connected to an input signal 860, while the gate terminal of the third n-type transistor 850 is connected to another input signal 865. Thus, the first n-type transistor 840 and the third n-type transistor 850 satisfy the fourth merging priority 420 and may be combined together to form a mega transistor.

Thus, in the first stage 805, one mega transistor may be formed (e.g., by combining the first n-type transistor 840 and the third n-type transistor 850). The mega transistor that is formed is similar to the mega transistor 485 in which the drain terminal of the first n-type transistor 840 is merged with the drain terminal of the third n-type transistor 850 in a common active region.

The second stage 810 of the circuit 800 includes two p-type transistors and two n-type transistors. Specifically, the second stage 810 includes a fourth p-type transistor 870 and a fifth p-type transistor 875. The drain terminal of each of the fourth p-type transistor 870 and the fifth p-type transistor 875 is connected to an output signal 880. Thus, each of the fourth p-type transistor 870 and the fifth p-type transistor 875 is an output transistor. Further, the fourth p-type transistor 870 and the fifth p-type transistor 875 satisfy the first merging priority 405 because their respective drain terminals are connected to the same signal (e.g., the output signal 880), their respective source terminals are connected to the same signal (e.g., supply voltage signal 885), and their respective gate terminals are connected to the same signal (e.g., the output signal 815). Thus, the fourth p-type transistor 870 and the fifth p-type transistor 875 may be combined to form a mega transistor.

The second stage 810 also includes a fourth n-type transistor 890 and a fifth n-type transistor 895, and their drain terminals are connected to the output signal 880. Thus, the fourth n-type transistor 890 and the fifth n-type transistor 895 are both output transistors. Further, the fourth n-type transistor 890 and the fifth n-type transistor 895 satisfy the first merging priority 405 because their respective source terminals are also connected to the same signal (e.g., ground voltage signal 897), and their respective gate terminals are connected to the same signal (e.g., the output signal 815). Thus, the fourth n-type transistor 890 and the fifth n-type transistor 895 may be combined to form a mega transistor. Therefore, there are two mega transistors in the second stage 810, which may replace the individual transistors from which those mega transistors are created in the standard cell layout.

By performing the standard cell layout using the mega transistors created in the circuit 800, inventors found that the speed of the circuit 800 increased by 3%, while the power consumption reduced by 4% without impacting the cell area.

Thus, the present disclosure provides a mechanism to create a mega transistor that provides an additional current path from the power supply voltage to the output in a p-type transistor and from the output to the ground voltage in an n-type transistor. The additional current path reduces parasitic resistance. The mega transistor may be created by combining the drain terminals of two transistors of the same type (e.g., either p-type or n-type) in a common drain layout. By using a common drain layout, the length of the interconnect metal used for the output may be reduced, thereby reducing the parasitic capacitance associated with the output. Further, by reducing the parasitic resistance and the parasitic capacitance, the circuit speed may be increased and the power consumption of the circuit maybe reduced. Further, in some embodiments, the overall cell area may be reduced.

In accordance with some aspects of the present disclosure, a method is disclosed. The method includes identifying a plurality of transistors in a circuit. A drain terminal of each of the plurality of circuits is connected to an output of the circuit. The method also includes determining that a first transistor and a second transistor of the plurality of transistors satisfy a merging priority, combining an active region of the first transistor and the second transistor to form a mega transistor having a common active region, and replacing the first transistor and the second transistor in a standard cell layout of the circuit with the mega transistor.

In accordance with some other aspects of the present disclosure, a non-transitory computer-readable media comprising computer-readable instructions is disclosed. The computer-readable instructions when executed by a processor cause the processor to identify a plurality of output transistors in a circuit such that each of the plurality of output transistors comprises a drain terminal connected to an output of the circuit. The computer-readable instructions also cause the processor to select one or more pairs of transistors from the plurality of output transistors based upon a merging priority. Each pair of the one or more pairs includes a first transistor and a second transistor that is of a same type as the first transistor. For each of the one or more pairs, the processor includes computer-readable instructions to combine an active region of the first transistor and the second transistor to form a mega transistor having a common active region, and replace the first transistor and the second transistor of each of the one or more pairs with the associated mega transistor in a standard cell layout of the circuit.

In accordance with yet other aspects of the present disclosure, a device is disclosed. The device includes a first transistor, the first transistor having a first drain terminal connected to an output of a circuit, and a second transistor of a same type as the first transistor, the second transistor having a second drain terminal connected to the output of the circuit. The first drain terminal of the first transistor and the second drain terminal of the second transistor are formed in a common active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

identifying, within a transistor-level circuit representation stored in computer-readable memory, a plurality of transistors in a circuit, wherein a drain terminal of each of the plurality of transistors is connected to an output of the circuit;

determining that a first transistor and a second transistor of the plurality of transistors satisfy a merging priority;

combining an active region of the first transistor and the second transistor to form a mega transistor having a common active region that, in a corresponding physical layout, comprises a single contiguous diffusion region containing both a first drain terminal of the first transistor and a second drain terminal of the second transistor to provide a direct current path between the first drain terminal and the second drain terminal and to reduce parasitic resistance and capacitance relative to unmerged active regions;

creating, by a standard cell layout application, a standard cell layout of the circuit with the mega transistor, wherein creating the standard cell layout comprises replacing the first transistor and the second transistor in the standard cell layout with the mega transistor and generating geometric data defining the single contiguous diffusion region having a width and length according to predetermined design rules to maintain said reduced parasitic resistance and capacitance;

generating, based on the standard cell layout and the geometric data, a representative data file configured to interface with fabrication tools to prepare a set of masks to fabricate the circuit;

forming an image on a first substrate to fabricate, using the representative data file, the set of masks wherein the set of masks includes, on an active-region mask layer, a single active-area feature corresponding to the common active region to simultaneously pattern both the first drain terminal and the second drain terminal as portions of the same contiguous diffusion region; and fabricating, using the set of masks, a semiconductor device comprising the circuit including the mega transistor having the common active region, wherein the fabrication comprises forming the common active region over a second substrate.

2. The method of claim 1, wherein the first transistor and the second transistor are both either n-type transistors or p-type transistors.

3. The method of claim 1, wherein the common active region combines the active region of a first drain terminal of the first transistor and a second drain terminal of the second transistor.

4. The method of claim 1, wherein the first transistor and the second transistor satisfy a first merging priority in which a first drain terminal of the first transistor and a second drain terminal of the second transistor are connected to the output, a first gate terminal of the first transistor and a second gate terminal of the second transistor are connected to a same first signal in the circuit, and a first source terminal of the first transistor and a second source terminal of the second transistor are connected to a same second signal in the circuit.

5. The method of claim 1, wherein the first transistor and the second transistor satisfy a second merging priority in which a first drain terminal of the first transistor and a second drain terminal of the second transistor are connected to the output, a first gate terminal of the first transistor and a second gate terminal of the second transistor are connected to a same signal in the circuit, and a first source terminal of the first transistor and a second source terminal of the second transistor are connected to different signals in the circuit.

6. The method of claim 1, wherein the first transistor and the second transistor satisfy a third merging priority in which a first drain terminal of the first transistor and a second drain terminal of the second transistor are connected to the output, a first source terminal of the first transistor and a second source terminal of the second transistor are connected to a same signal in the circuit, and a first gate terminal of the first transistor and a second gate terminal of the second transistor are connected to different signals in the circuit.

7. The method of claim 1, wherein the first transistor and the second transistor satisfy a fourth merging priority in which a first drain terminal of the first transistor and a second drain terminal of the second transistor are connected to the output, a first source terminal of the first transistor and a second source terminal of the second transistor are connected to first different signals in the circuit, and a first gate terminal of the first transistor and a second gate terminal of the second transistor are connected to second different signals in the circuit.

8. The method of claim 1, further comprising:

creating a netlist for the circuit;

identifying at least one output net from the netlist; and selecting the plurality of transistors from the at least one output net.

9. The method of claim 1, wherein the circuit is a single stage circuit, and wherein the output is an overall output when the circuit is the single stage circuit.

10. A first memory of a non-transitory computer-readable media comprising computer-readable instructions which when executed by a processor cause the processor to:

identify, within a transistor-level circuit representation stored in a second computer-readable memory, a plurality of output transistors in a circuit, wherein each of the plurality of output transistors comprises a drain terminal connected to an output of the circuit;

select one or more pairs of transistors from the plurality of output transistors based upon a merging priority, wherein each pair of the one or more pairs comprises a first transistor and a second transistor that is of a same type as the first transistor;

for each of the one or more pairs, combine an active region of the first transistor and the second transistor to form a mega transistor having a common active region that, in a corresponding physical layout, comprises a single contiguous diffusion region containing both a first drain terminal of the first transistor and a second drain terminal of the second transistor to provide a direct current path between the first drain terminal and the second drain terminal and to reduce parasitic resistance and capacitance relative to unmerged active regions;

create, by a standard cell layout application, a standard cell layout of the circuit with the mega transistor, wherein creating the standard cell layout comprises replacing the first transistor and the second transistor of each of the one or more pairs with the mega transistor in the standard cell layout and generating geometric data defining the single contiguous diffusion region having a width and length according to predetermined design rules to maintain said reduced parasitic resistance and capacitance;

generate, based on the standard cell layout and the geometric data, a representative data file configured to interface with fabrication tools to prepare a set of masks to fabricate the circuit;

form an image on a first substrate to fabricate, using the representative data file, the set of masks, wherein the set of masks includes, on an active-region mask layer, a single active-area feature corresponding to the common active region to simultaneously pattern both the first drain terminal and the second drain terminal as portions of the same contiguous diffusion region; and fabricate, using the set of masks, a semiconductor device comprising the circuit including the mega transistor having the common active region, wherein the fabrication comprises forming the common active region over a second substrate.

11. The non-transitory computer-readable media of claim 10, wherein the common active region combines the active region of a first drain terminal of the first transistor and a second drain terminal of the second transistor.

12. The non-transitory computer-readable media of claim 10, wherein the merging priority comprises a first merging priority, a second merging priority, a third merging priority, and a fourth merging priority, and wherein the first transistor and the second transistor of each of the one or more pairs are selected based upon the first transistor and the second transistor satisfying the first merging priority, the second merging priority, the third merging priority, or the fourth merging priority.

13. The non-transitory computer-readable media of claim 12, wherein the first transistor and the second transistor satisfy the first merging priority if a first drain terminal of the first transistor and a second drain terminal of the second transistor are connected to the output, a first gate terminal of the first transistor and a second gate terminal of the second transistor are connected to a same first signal, and a first source terminal of the first transistor and a second source terminal of the second transistor are connected to a same second signal.

14. The non-transitory computer-readable media of claim 12, wherein the first transistor and the second transistor satisfy the second merging priority if a first drain terminal of the first transistor and a second drain terminal of the second transistor are connected to the output, a first gate terminal of the first transistor and a second gate terminal of the second transistor are connected to a same signal, and a first source terminal of the first transistor and a second source terminal of the second transistor are connected to different signals.

15. The non-transitory computer-readable media of claim 12, wherein the first transistor and the second transistor satisfy the third merging priority if a first drain terminal of the first transistor and a second drain terminal of the second transistor are connected to the output, a first source terminal of the first transistor and a second source terminal of the second transistor are connected to a same signal, and a first gate terminal of the first transistor and a second gate terminal of the second transistor are connected to different signals.

16. The non-transitory computer-readable media of claim 12, wherein the first transistor and the second transistor satisfy the fourth merging priority if a first drain terminal of the first transistor and a second drain terminal of the second transistor are connected to the output, a first source terminal of the first transistor and a second source terminal of the second transistor are connected to first different signals, and a first gate terminal of the first transistor and a second gate terminal of the second transistor are connected to second different signals.

17. The non-transitory computer-readable media of claim 10, wherein the circuit is a single stage circuit, and wherein the output is an overall output when the circuit is the single stage circuit.

18. The non-transitory computer-readable media of claim 10, wherein the processor further executes computer-readable instructions to:

create a netlist for the circuit;

identify at least one output net from the netlist; and select the plurality of output transistors from the at least one output net.

19. The non-transitory computer-readable media of claim 10, wherein the circuit is a multi-stage circuit, and wherein the output is either an overall output or an intermediate output when the circuit is the multi-stage circuit.

20. The method of claim 1, wherein the circuit is a multi-stage circuit, and wherein the output is either an overall output or an intermediate output when the circuit is the multi-stage circuit.

* * * * *